(12) United States Patent
Vasudev et al.

(10) Patent No.: US 11,275,131 B1
(45) Date of Patent: Mar. 15, 2022

(54) TEST AND MEASUREMENT INSTRUMENT FOR DETERMINING MAXIMUM FLUX DENSITY

(71) Applicant: Tektronix, Inc., Beaverton, OR (US)

(72) Inventors: U N Vasudev, Bengaluru (IN); Suman Babu Alaparthi, Bengaluru (IN); Niranjan R Hegde, Siddapur (IN); Krishna N H Sri, Bengaluru (IN)

(73) Assignee: Tektronix, Inc., Beaverton, OR (US)

( * ) Notice: Subject to any disclaimer, the term of this patent is extended or adjusted under 35 U.S.C. 154(b) by 19 days.

(21) Appl. No.: 16/599,067

(22) Filed: Oct. 10, 2019

Related U.S. Application Data

(60) Provisional application No. 62/745,911, filed on Oct. 15, 2018.

(51) Int. Cl.
*G01R 33/14* (2006.01)
*G01R 33/02* (2006.01)
*H01F 27/24* (2006.01)

(52) U.S. Cl.
CPC ............. *G01R 33/14* (2013.01); *G01R 33/02* (2013.01); *H01F 27/24* (2013.01)

(58) Field of Classification Search
None
See application file for complete search history.

(56) References Cited

U.S. PATENT DOCUMENTS

| 2,337,231 | A  | * | 12/1943 | Raymondt | G01R 33/14 324/227 |
| 7,222,034 | B2 | * | 5/2007  | Ramesh   | G01R 33/14 324/200 |

\* cited by examiner

*Primary Examiner* — Douglas X Rodriguez
(74) *Attorney, Agent, or Firm* — Miller Nash LLP; Andrew J. Harrington

(57) ABSTRACT

A test and measurement instrument, including at least one port configured to receive a signal from a device under test (DUT), the signal including a current signal acquired across a magnetic core of the DUT and a voltage signal acquired across the magnetic core of the DUT, and one or more processors. The one or more processors are configured to determine a hysteresis loop based on the current signal and the voltage signal, determine a magnetic flux of the magnetic core based on the voltage signal and the current signal for a number of sample points for each cycle, and determine a maximum magnetic flux for all cycles and a hysteresis loop cycle that corresponds to the maximum magnetic flux. A display configured to display at least one of the hysteresis loop, the signal received from the DUT, and the hysteresis loop cycle that corresponds to the maximum magnetic flux.

20 Claims, 7 Drawing Sheets

TEST AND MEASUREMENT INSTRUMENT FOR DETERMINING MAXIMUM FLUX DENSITY

CROSS-REFERENCE TO RELATED APPLICATIONS

This application claims the benefit of U.S. Provisional Pat. App. No. 62/745,911, filed Oct. 15, 2018, the entire contents of which are hereby incorporated by reference.

TECHNICAL FIELD

This disclosure is directed to systems and methods related to test and measurement systems, and in particular, to hysteresis loop measurement of a magnetic core of a device under test by a test and measurement instrument.

BACKGROUND

Many electronic circuits use components that have magnetic cores, such as transformers or inductors. An important part of magnetic core design is the flux density (B) and magnetic field strength (H) curves, also known as a B-H curve or a hysteresis loop. The B-H curve characterizes the magnetic core and can give an insight of the expected behavior of the magnetic core during in-circuit operations. The expected behavior of the magnetic core may be critical for the stable operation of some electronic circuits, such as switched-mode power supply (SMPS) circuits.

It can be useful to analyze inductance variations in in-circuit operations using a maximum flux density of a magnetic core over time. However, identifying the maximum flux density is extremely time consuming since hundreds, thousands, or even tens of thousands of B-H curves may be captured over a period of time.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Figure 1:
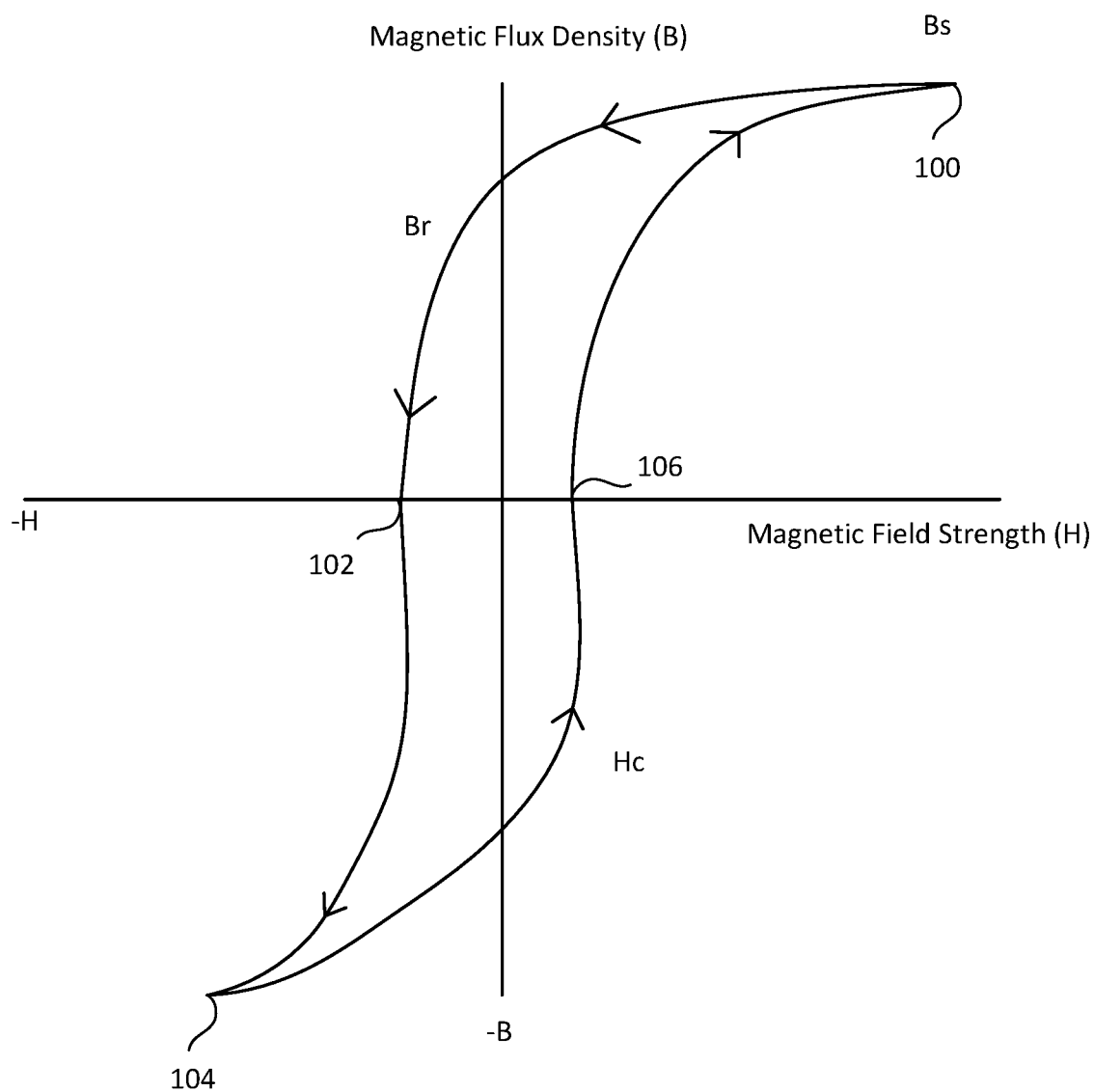
FIG. 1 is an example hysteresis loop of a magnetic material.

Stability of a magnetic core can be crucial for electronic circuit design, and the stability of the magnetic core may vary based on environment, such as with temperature or based on various properties of the core itself. The B-H curve, as mentioned above, is the expected characteristic of the magnetic material during operation of an electronic circuit. The B-H curve includes a remenance flux density (Br) value, a coercive force (Hc) value, and a saturation flux density (Bs) value. The Br value is also known as residual induction that remains in the magnetic material of the magnetic core after an externally applied magnetic field (H) has returned to zero.

A magnetic material used for the magnetic core dictates the magnetizing property suitable for specific electrical applications. For example, soft ferromagnetic materials, such as iron or silicon steel, have very narrow magnetic hysteresis loops resulting in small amounts of residual magnetism. The properties of low remenance can make soft ferromagnetic materials suitable for relays, solenoids, and transformers, as they can be easily magnetized and demagnetized.

For wireless charging, such as for cell phones or inductive charging of electric vehicles, ensuring magnetic cores of magnetic components are in a stable region of operation under all conditions is critical for design efficiency. Embodiments of the disclosure allow a user to measure the B-H curve for these devices under test that have magnetic cores under a variety of conditions and allow a user to be able to determine design efficiency.

An operating point of a magnetic component may be viewed by plotting the B-H curve, but can also be quantified by measuring a peak flux density, remnant flux density, permeability, and coercivity. Ideally, permeability is calculated using a hysteresis loop cycle that has a maximum flux density (Bpeak), compared to other cycles, to analyze inductance variation in in-circuit operation. Embodiments of the disclosure, which will be discussed in more detail below, allow a user to select and view a hysteresis loop cycle that has the maximum flux density, which also be referred to herein as the Bpeak curve. This may allow a user to easily see the worst case hysteresis loop cycle and how the voltage and/or current across or through a magnetic core is behaving during the worst case hysteresis loop cycle. This may provide important debugging information for magnetic circuit designers.

Disclosed herein is a test and measurement instrument, including at least one port configured to receive a signal from a device under test (DUT), the signal including a current signal acquired across a magnetic core of the DUT and a voltage signal acquired across the magnetic core of the DUT, and one or more processors. The one or more processors are configured to determine a hysteresis loop based on the current signal and the voltage signal, determine a magnetic flux of the magnetic core based on the voltage signal and the current signal for a number of sample points for each cycle, and determine a maximum magnetic flux and a hysteresis loop cycle that corresponds to the maximum magnetic flux. A display configured to display at least one of the hysteresis loop, the signal received from the DUT, and the hysteresis loop cycle that corresponds to the maximum magnetic flux.

FIG. 1 illustrates an example ideal B-H curve for a magnetic material. As discussed above, the B-H curve illustrates the effect of magnetic saturation. In particular, the B-H curve of FIG. 1 illustrates the effect of applying an external magnetic field to unmagnetized iron. The magnetism curve starts at the origin point of reference point 106 and increases as the magnetic field strength increases, magnetizing the iron, toward reference point 100, as shown by the arrows. As the magnetic field is reversed, the iron eventually becomes magnetized in the reverse direction, passing through reference point 102, until it again saturates at reference point 104. A stable magnetic core means a B-H curve will trace the flow of reference points 100, 102, 104, and 106 marked on FIG. 1 relatively consistently for every cycle of operation. However, this may not happen due to various interferences within the circuit, as well as environmental factors, such as temperature.

B-H curves are different for various magnetic cores based on air, iron, and copper properties. Magnetic saturation points are also different for various magnetic cores. Further, there is a limit to the amount of flux density (B) that can be generated by the magnetic core and any further increase in a magnetic field strength (H) will have no effect. This is referred to as the saturation point (Bs, Hs).

For ferromagnetic materials, the ratio of flux density (B) to magnetic field strength (H) is not constant but varies with the flux density (B). This is known as permeability, which is the ratio of B and H calculated on the worst case (Bpeak) of a hysteresis loop cycle. However, for air cored coils or any non-magnetic medium cores, such as woods or plastics, permeability can be considered as a constant, i.e., such materials retain no magnetic remenance, and for free space the value is $4\pi \times 10^7$ H/m. As such, the center opening of the B-H curve varies for different magnetic materials. Embodiments of the disclosure can identify the hysteresis loop cycle that results in the maximum flux density, for easy viewing and debugging by a user, as well as to be able to determine the permeability of the magnetic core.

The signal from the device under test at a test and instrument may include an extremely long data record, including hundred, thousands, or even tens of thousands of cycles, taken over an extended period of time and sometimes in different environments, such as at different temperatures. This may results in hundreds, thousands, or more hysteresis loop cycles, which may make it extremely difficult to identify which hysteresis loop cycle is contributing to a worst case flux density. However, being able to identify when and under what circumstances a worse case flux density occurred may be beneficial to a circuit designer. Embodiments of the disclosure, as will be discussed in detail below, are advantageous and provide an improvement by not requiring a user to comb through potentially thousands of hysteresis loop cycles, but rather easily automatically identifying which hysteresis loop cycle corresponds to a worse case flux density.

Figure 2:
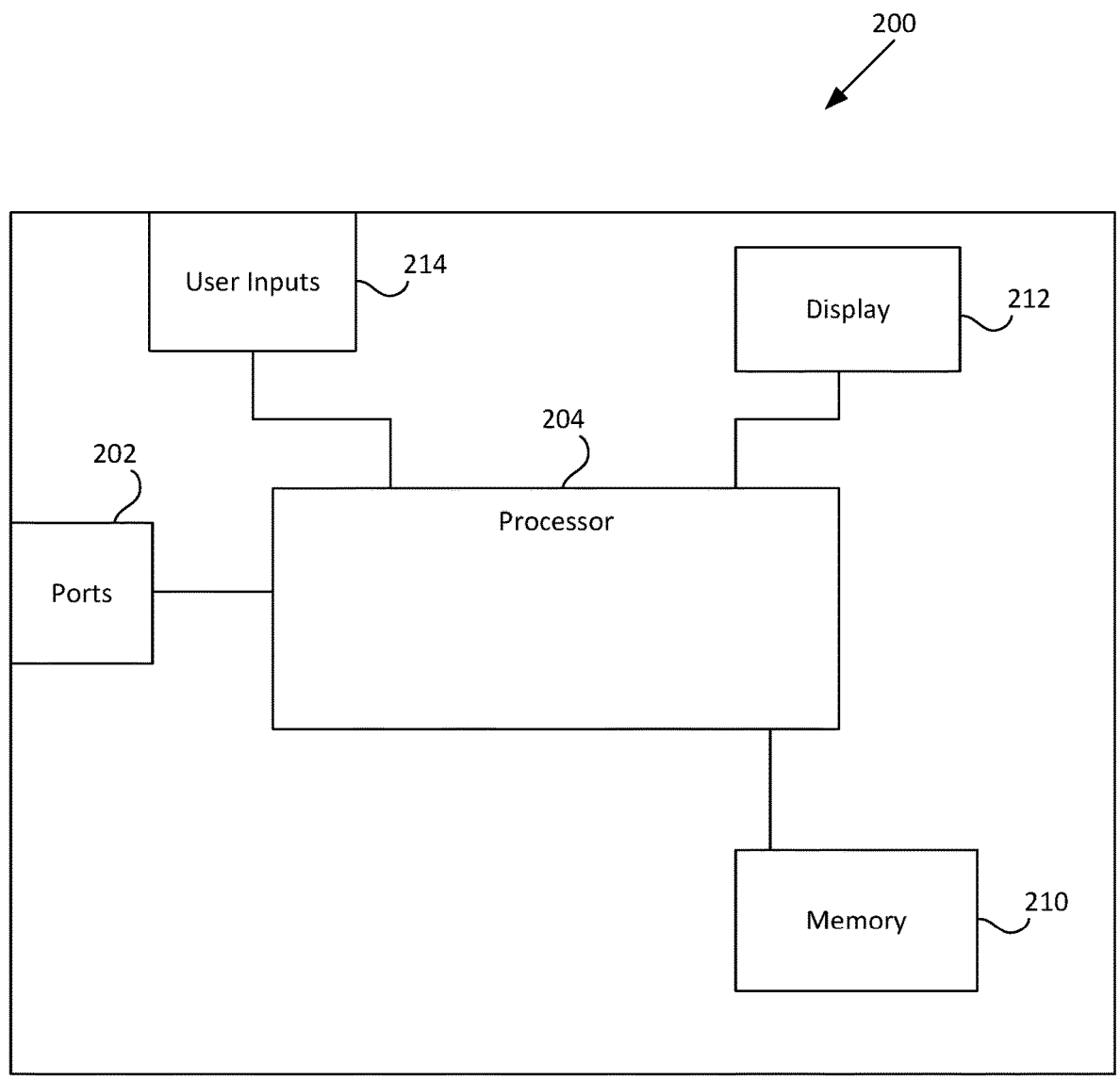
FIG. 2 is a block diagram of an example test and measurement instrument according to some embodiments of the disclosure.

FIG. 2 is a schematic block diagram of an example test instrument 200, such as an oscilloscope, for implementing embodiments of the disclosure disclosed herein. The instrument 200 includes a number of ports 202, which may be any electrical signaling medium. Ports 202 may include receivers, transmitters, and/or transceivers, for example. One or more of the ports 202 may be connected to a device under test to receive a signal from the magnetic core of the device under test. The electrical signal may include a current waveform and a voltage waveform across the magnetic core of the device under test. The ports 202 are coupled with a processor 204, which may either include a measurement unit or may connect to a measurement unit. Such a measurement unit can include any component capable of measuring aspects (e.g., voltage, amperage, amplitude, etc.) of a signal received via ports 202. The pipeline depicted from ports 202 to processor 204 can include conditioning circuits, an analog to digital converter, and/or other circuitry to convert a received signal to a waveform for further analysis. The resulting waveform or parameters thereof can then be stored in a memory 210.

The processor 204, may be implemented as any processing circuitry, such as an application specific integrated circuit (ASIC), a digital signal processor (DSP), a field programmable gate array (FPGA), etc. The processor 204 is configured to execute instructions from memory 210 and may perform any methods and/or associated steps indicated by such instructions. Memory 210 may be implemented as processor cache, random access memory (RAM), read only memory (ROM), solid state memory, hard disk drive(s), and/or any other memory type. Memory 210 may include multiple memories of different types. Memory 210 acts as a medium for storing data, computer program products, and other instructions, and providing such data/products/instruction to the processor 204 for computation as desired. Memory 210 also stores, for example, information or commands received from user inputs 214 for use by the processor 204.

User inputs 214 are coupled to the processor 204. User inputs 214 may include a keyboard, mouse, trackball, touchscreen, and/or any other controls employable by a user to interact with a graphical user interface (GUI) on a display 212. The display 212 may be a digital screen, a cathode ray tube based display, or any other monitor to display test results to a user as discussed herein. While the components of test instrument 200 are depicted as being integrated within test instrument 200, it will be appreciated by a person of ordinary skill in the art that any of these components can be external to test instrument 200 and can be coupled to test instrument 200 in any conventional manner (e.g., wired and/or wireless communication media and/or mechanisms).

The processor 204 may receive through user inputs 214 or any other input method, such as from memory 210, magnetic properties of the magnetic material, as well as the cross sectional area of the magnetic core of the device under test and the primary number of turns for the magnetic component of the device under test.

As the signal is received from the device under test at the processor 204, the processor 204 generates a hysteresis loop, or B-H curve, for each cycle of the signal from the device under test. The processor 204 also may determine a flux density (B) at one or more sample points using the signal received from the device under test. The number of sample points used may be determined based on the processing speed of the processor 204, as well as a memory size of memory 210.

The flux density (B) may be determined using equation (1):

$$B(t) = Bdc + \left\{ \frac{Vi(t)}{\text{primary number of turns} * \text{cross section area}} \right\} \quad (1)$$

where Bdc is the direct current flux density that determines an operating point of the magnetic component, such as an inductor or transformer, in an in-circuit operation of the device under test, and Vi(t) is integral of the voltage waveform until time t. The primary number of turns and the cross section area are the actual physical parameters of the magnetic core, as received by the processor 204 through the user inputs 214 or the memory 210.

The flux density B(t) at every sample point may be saved, for example, in memory 210. The processor 204 may then determine which flux density B(t) is the maximum flux density, and can determine which hysteresis loop cycle corresponds to the maximum flux density. The maximum flux density may change as the signal is received from the device under test. That is, in real-time, or near real-time, the flux density (B) is determined as the signal from the device under test is received, and as a new maximum flux density is determined, then a new hysteresis loop cycle that corresponds to the new maximum flux density can be determined. That is, the process may be an ongoing process that is continually updated, or it may be performed once an entire data record of the signal from the device under test has been received.

The processor 204 may also determine corresponding current waveform peaks to define boundaries for the maximum flux density hysteresis loop cycle. The processor 204 may output this determination to the display 212, as will be discussed in more detail below.

Figure 3:
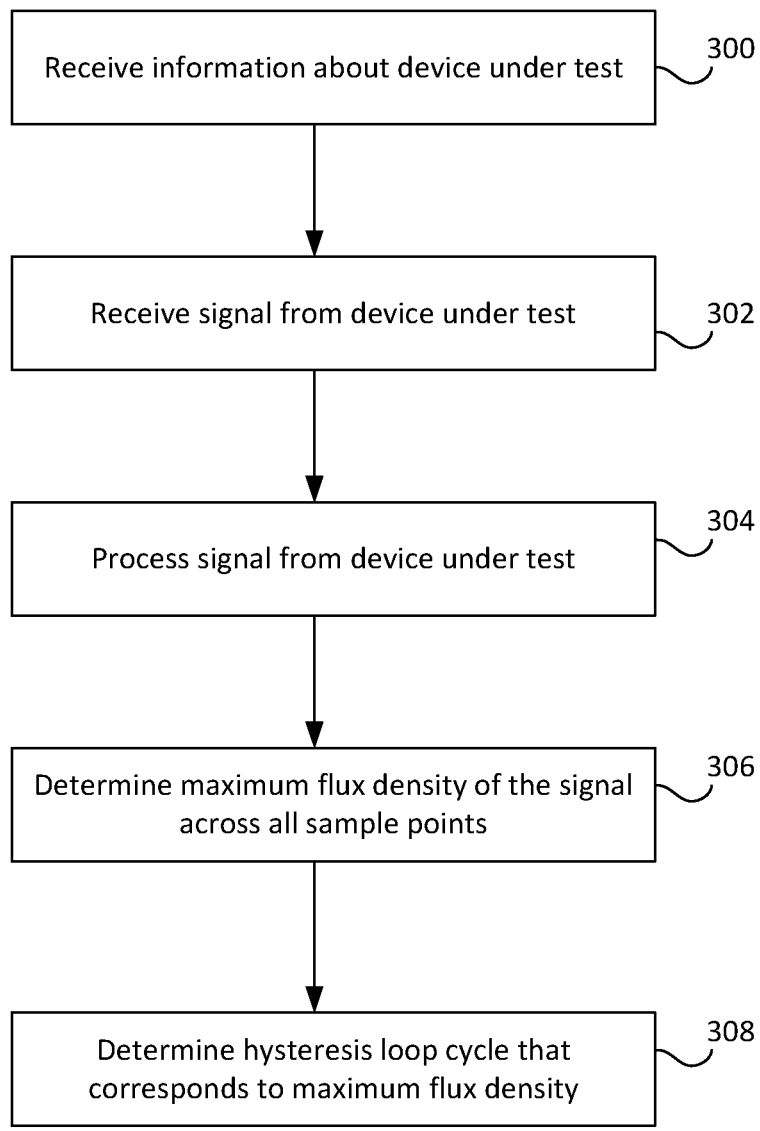
FIG. 3 is a flow chart illustrating an example operation of the test and measurement instrument according to embodiments of the disclosure.

FIG. 3 illustrates an example operation of the test and measurement instrument 200 according to some embodiments of the disclosure. Initially, information is received 300 regarding the device under test at the processor 204. The information may be received from the user inputs 214 and/or the memory 210. The information, as mentioned above, may include magnetic properties of the magnetic core of the device under test, as well as the physical properties, such as the number of primary turns and cross sectional area of the magnetic core of the magnetic component of the device under test.

In operation 302, the processor 204 can receive the signal from the device under test, which may include current waveforms and voltage waveforms across the magnetic core. In operation 304, the processor 204 processes the signal received from the device under test. Processing the signal received from the device under test includes determining a hysteresis loop for the device under test, as well as determining the flux density B for one or more sample points for each hysteresis loop cycle.

In operation 306, the processor 204 determines the maximum flux density B for all of the sample points for the entire hysteresis loop. In operation 308, the processor 204 determines which hysteresis loop cycle and which current waveform peaks from the signal under test define the boundaries for the hysteresis loop cycle that corresponds to the maximum flux density B determined in operation 306.

During any of the operations discussed in FIG. 3, the display may display the signals from the device under test as they are processed by the processor 204 or may be displayed after processing. Different waveforms may be displayed on the display based on a user input at the user input 214.

Figure 4:
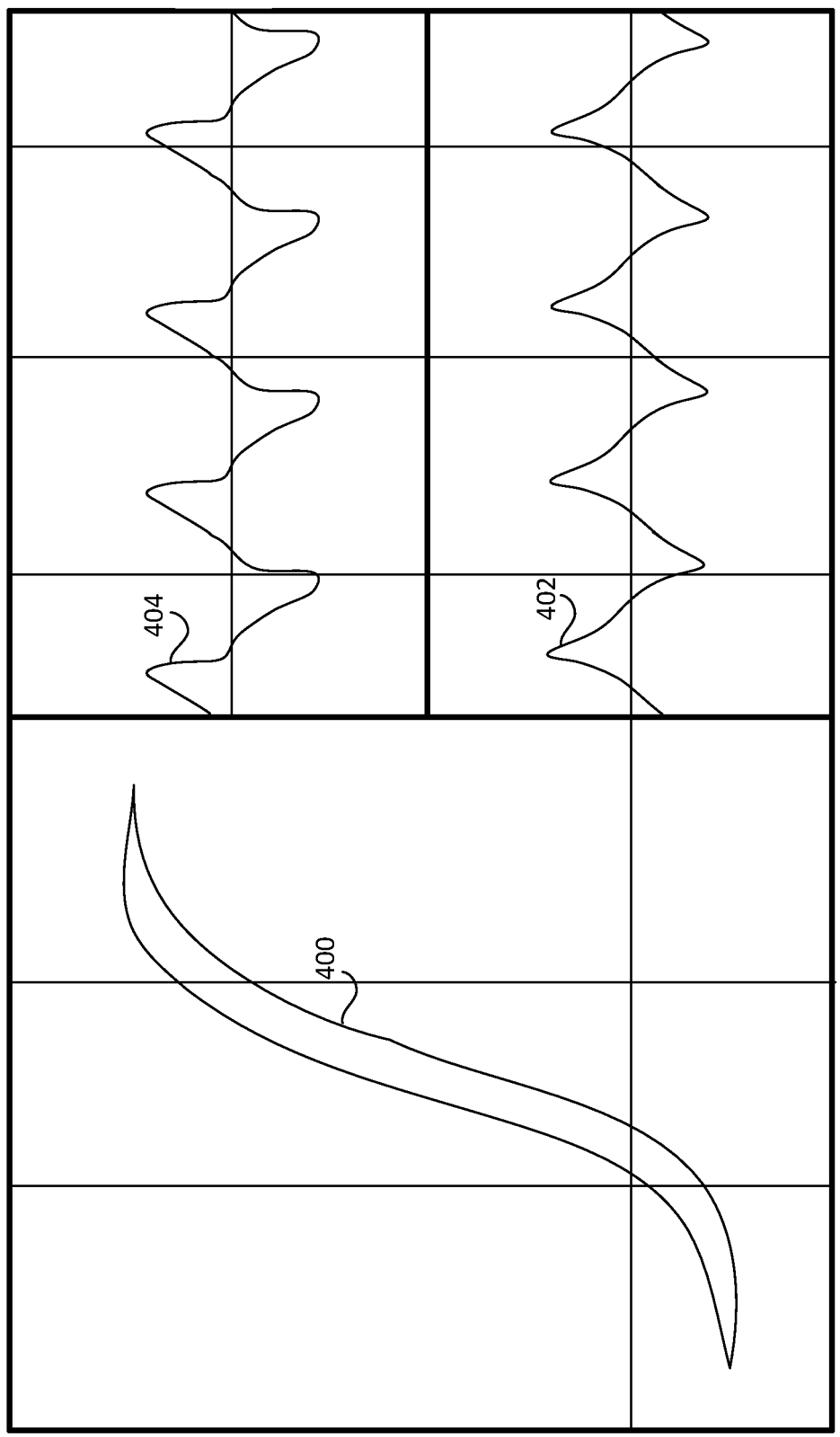
FIG. 4 is an example display output according to embodiments of the disclosure.

For example, in example display of FIG. 4, a hysteresis loop for all cycles 400 may be shown on the display, along with the current waveforms 402 and the voltage waveforms 404 from the signal from the device under test. In some embodiments, the hysteresis loop cycle that corresponds to the maximum density flux may be displayed in a manner that distinguishes it from the remaining hysteresis loop cycles, such as being brighter or in a different line style or color.

Figure 5:
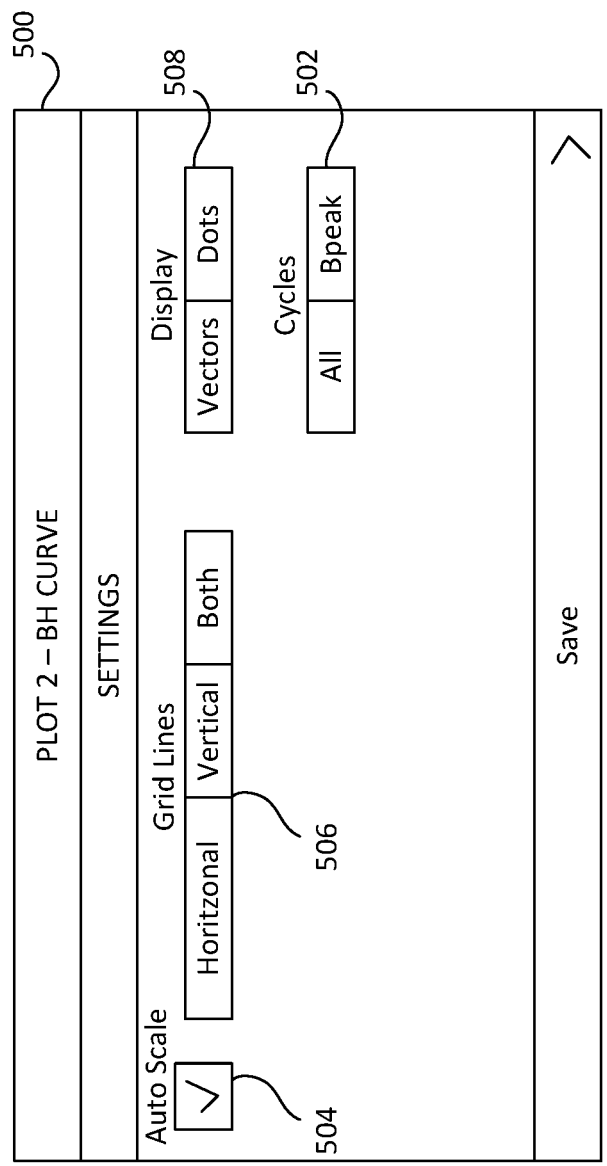
FIG. 5 is an example graphical user interface of a display according to embodiments of the disclosure.

A GUI on the display 212 may output a dialogue box to a user to allow a user to select options using the user inputs 214. For example, as seen in FIG. 5, the dialogue box 500 may provide an option for a user to select to only view the maximum flux density hysteresis loop cycle (referred to as Bpeak cycle) as shown at reference number 502 and the corresponding waveforms. The user may also select an auto scale 504, whether gridlines should be visible 506, and whether to display vectors or dots 508. Embodiments of the disclosure are not limited to only these options for display, but rather, these options are shown purely for example purposes only. Other display options may be presented to the user as well.

Figure 6:
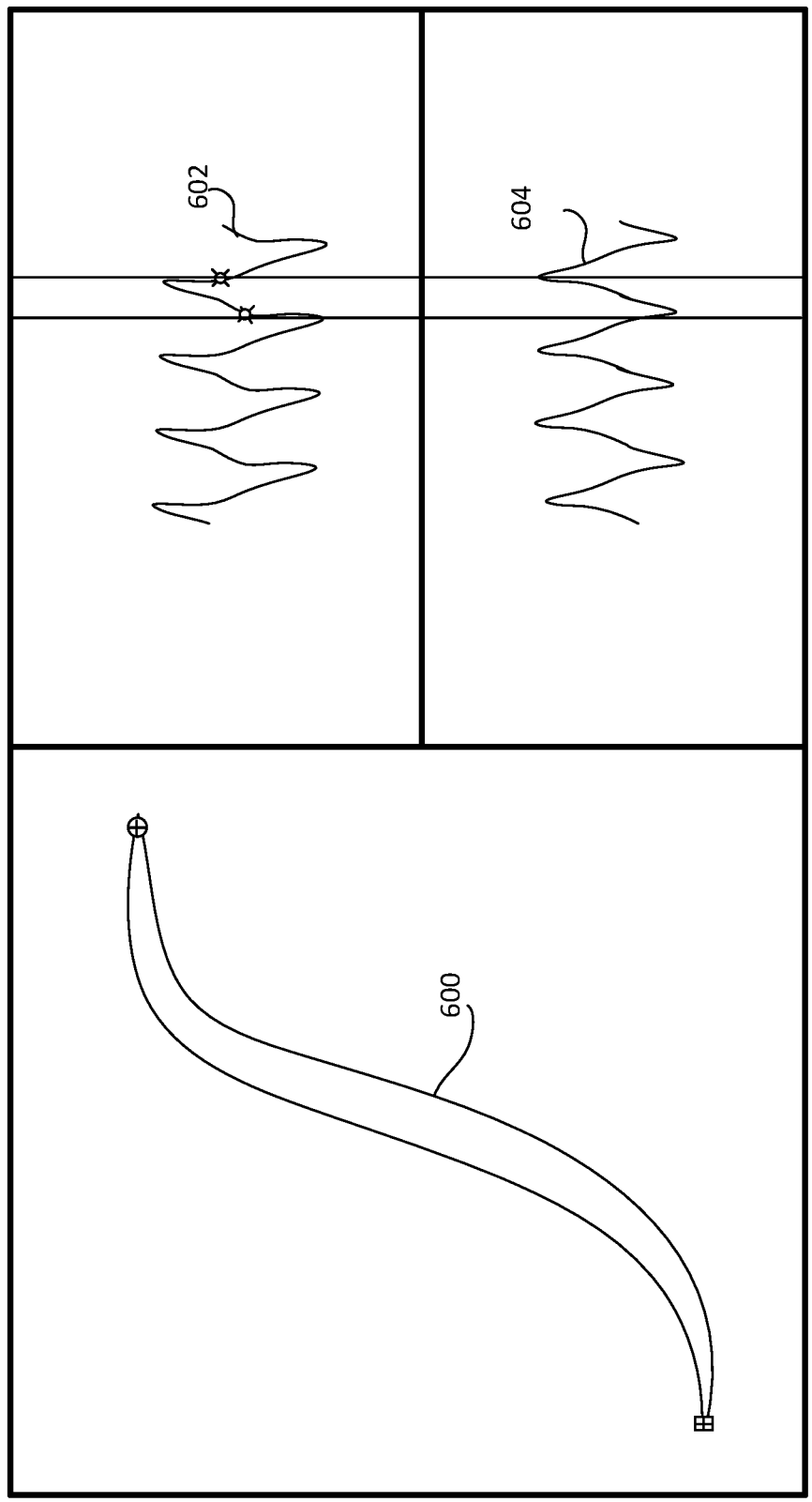
FIG. 6 is another example display output according to embodiments of the disclosure.

When the Bpeak cycle is selected in the dialogue box 500, the display 212 may display an example output as shown in FIG. 6. The display of FIG. 6 includes only the hysteresis loop cycle 600 that corresponds to the maximum flux density identified by the processor 204. The display of FIG. 6 may also display the corresponding current waveform 602 and the voltage waveform 604 that correspond to the hysteresis loop cycle 600, as well as a few signals prior to and/or after the corresponding current waveform 602 and voltage waveform 604. Cursors may be turned on via user inputs 214, and then cursors may be provided on each of the hysteresis loop cycle 600, the current waveform 602, and the voltage waveform 604. Cursors may be automatically placed at the sample points on the current waveform 602 and voltage waveform 604 that correspond to the identified Bpeak cycle. As a cursor is moved on one of the hysteresis loop cycle 600, the current waveform 602, and the voltage waveform 604, the cursor of the other waveforms may also be moved in conjunction.

Figure 7:
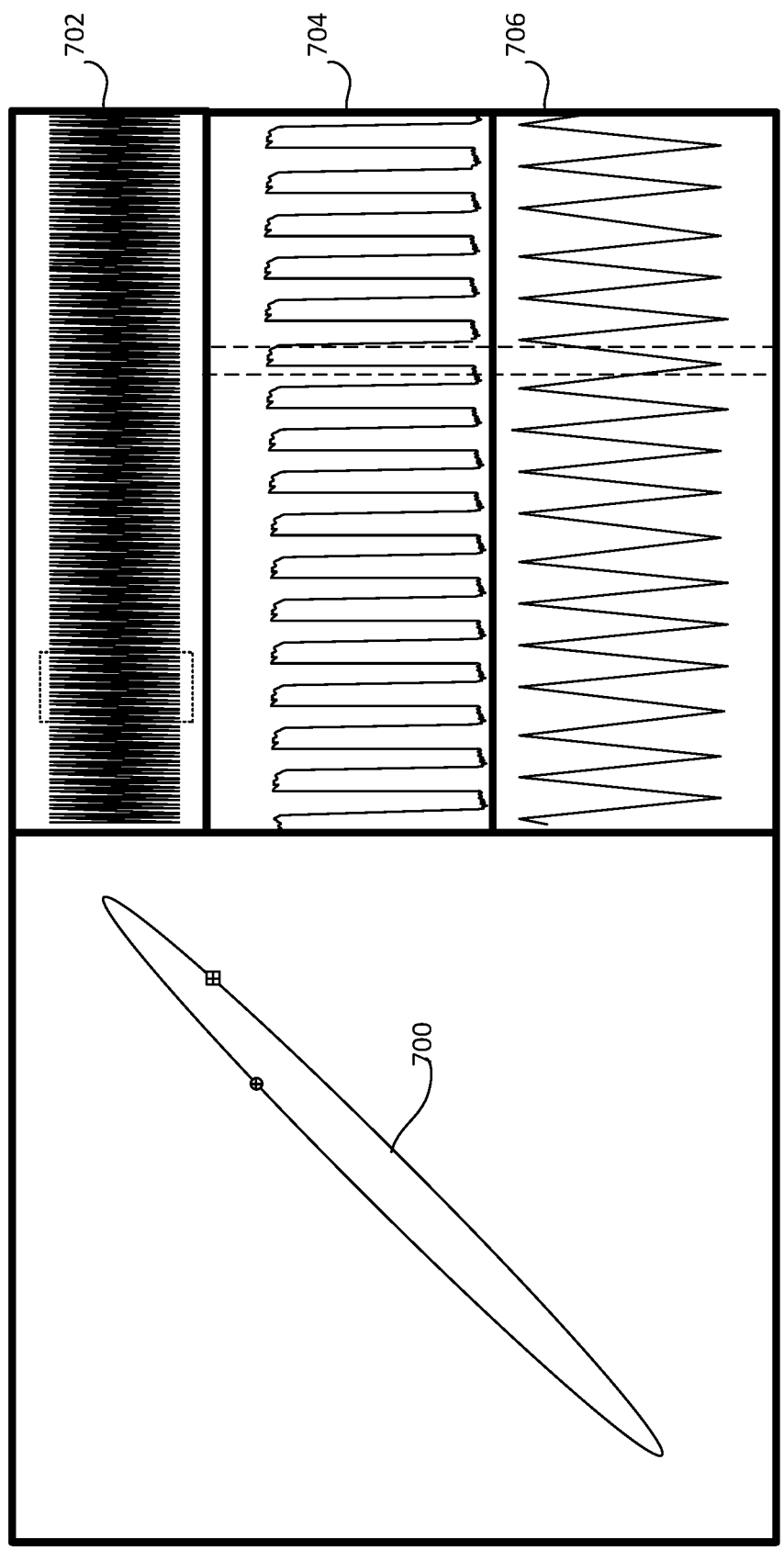
FIG. 7 is another example display output according to embodiments of the disclosure.

FIG. 7 is an example of signal from a device under test with a long record length waveform resulting in thousands of hysteresis loop cycles. However, in the display of FIG. 7, a user has selected to view only the Bpeak cycle of the hysteresis loop as shown at 700. A portion of the overall data record is shown in window 702. Windows 704 and 706 display zoomed in portions of the current waveform and the voltage waveform, respectively, that correspond to the Bpeak cycle of the hysteresis loop 700. Similar to FIG. 6, a user may move a cursor via user inputs 214 on any one of the waveforms the cursors on the other waveforms will move in response as well. This can allow a user to place their cursor, for example, on a portion of the hysteresis loop 700 they are interested in and see what was happening in the current and voltage waveforms at that time.

Although both current and voltage waveforms are shown on the displays of FIGS. 4, 6, and 7, only one of the current and voltage waveform or neither the current and voltage waveform may be shown in conjunction with the hysteresis loop or hysteresis loop cycle displayed. That is, using the user inputs 214, a user may specific what information a user desires to see displayed based on what information is beneficial to the user.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement instrument, comprising at least one port configured to receive a signal from a device under test, the signal including a current signal acquired across a magnetic core of the device under test and a voltage signal acquired across the magnetic core of the device under test; one or more processors configured to: determine a magnetic hysteresis loop based on the current signal and the voltage signal, the magnetic hysteresis loop including a number of cycles, determine a magnetic flux of the magnetic core based on the voltage signal and the current signal for a number of sample points for each cycle, for each cycle, based on the determined magnetic flux for the number of sample points, determine a maximum magnetic flux of a present cycle, and select the maximum magnetic flux of all the cycles and determine a magnetic hysteresis loop cycle that corresponds to the maximum magnetic flux of all the cycles; and a display configured to display at least one of the magnetic hysteresis loop, the signal received from the device under test, and the magnetic hysteresis loop cycle that corresponds to the maximum magnetic flux of all the cycles.

Example 2 is the test and measurement instrument of example 1, wherein the one or more processors are further configured to determine at least one of a corresponding portion of the current signal and a corresponding portion of the voltage signal that corresponds to the maximum magnetic flux of all the cycles.

Example 3 is the test and measurement instrument of example 2, wherein the display is further configured to display at least one of the corresponding portion of the current signal and the corresponding portion of the voltage signal.

Example 4 is the test and measurement instrument of any one of examples 1-3, further comprising a user interface configured to receive a user input indicating magnetic properties of the magnetic core.

Example 5 is the test and measurement instrument of example 4, wherein the user input is further configured to receive a user input indicating physical properties of the device under test, including a number of turns around the magnetic core and a cross section area of the magnetic core.

Example 6 is the test and measurement instrument of any one of examples 1-4, wherein the display is configured to display the magnetic hysteresis loop and the magnetic hysteresis loop cycle that corresponds to the maximum magnetic flux of all the cycles in a color different from the magnetic hysteresis loop.

Example 7 is the test and measurement instrument of any one of examples 1-6, further comprising a user input configured to receive an input indicating a location on the magnetic hysteresis loop cycle that corresponds to the maximum magnetic flux of all the cycles, and the one or more processors are further configured to determine a corresponding point in at least one of the current signal or the voltage signal.

Example 8 is a method for measuring a magnetic cord of a device under test, comprising receiving a signal from a device under test, the signal including a current signal acquired across a magnetic core of the device under test and a voltage signal acquired across the magnetic core of the device under test; determining a magnetic hysteresis loop based on the current signal and the voltage signal, the magnetic hysteresis loop including a number of cycles; determining a magnetic flux of the magnetic core based on the voltage signal and the current signal for a number of sample points for each cycle, for each cycle, based on the determined magnetic flux for the number of sample points, determining a maximum magnetic flux of a present cycle, and selecting the maximum magnetic flux of all the cycles and determining a magnetic hysteresis loop cycle that corresponds to the maximum magnetic flux of all the cycles; and displaying at least one of the magnetic hysteresis loop, the signal received from the device under test, and the magnetic hysteresis loop cycle that corresponds to the maximum magnetic flux.

Example 9 is the method of example 8, further including determining at least one of a corresponding portion of the current signal and a corresponding portion of the voltage signal that corresponds to the maximum magnetic flux of all the cycles.

Example 10 is the method of example 9, further comprising displaying at least one of the corresponding portion of the current signal and the corresponding portion of the voltage signal.

Example 11 is the method of any one of examples 8-10, further comprising receiving a user input indicating magnetic properties of the magnetic core.

Example 12 is the method of any one of examples 8-11, further comprising receiving an input indicating physical properties of the device under test, including a number of turns around the magnetic core and a cross section area of the magnetic core.

Example 13 is the method of any one of examples 8-12, further comprising displaying the magnetic hysteresis loop and the magnetic hysteresis loop cycle that corresponds to the maximum magnetic flux of all the cycles in a color different from the magnetic hysteresis loop.

Example 14 is the method of any one of examples 8-13, further comprising receiving an input indicating a location on the magnetic hysteresis loop cycle that corresponds to the maximum magnetic flux of all the cycles, and the one or more processors are further configured to determine a corresponding point in at least one of the current signal or the voltage signal.

Example 15 is one or more computer readable storage media having instructions stored thereon that, when executed by a processor of a test and measurement system, cause the test and measurement system to receive a signal from a device under test, the signal including a current signal acquired across a magnetic core of the device under test and a voltage signal acquired across the magnetic core of the device under test; determine a magnetic hysteresis loop based on the current signal and the voltage signal, the magnetic hysteresis loop including a number of cycles; determine a magnetic flux of the magnetic core based on the voltage signal and the current signal for a number of sample points for each cycle; and determine a maximum magnetic flux and a magnetic hysteresis loop cycle that corresponds to the maximum magnetic flux.

Example 16 is the one or more computer readable storage media of example 15, further including instructions that cause the test and measurement to determine at least one of a corresponding portion of the current signal and a corresponding portion of the voltage signal that corresponds to the maximum magnetic flux.

Example 17 is the one or more computer readable storage media of example 16, further including instructions that cause the test and measurement to display on a display at least one of the corresponding portion of the current signal and the corresponding portion of the voltage signal.

Example 18 is the one or more computer readable storage media of any one of examples 15-17, further including instructions that cause the test and measurement to receive an input indicating physical properties of the device under test, including a number of turns around the magnetic core and a cross section area of the magnetic core.

Example 19 is the one or more computer readable storage media of any one of examples 15-18, further including instructions that cause the test and measurement to display on a display the magnetic hysteresis loop and the magnetic hysteresis loop cycle that corresponds to the maximum magnetic flux in a color different from the magnetic hysteresis loop.

Example 20 is the one or more computer readable storage media of any one of examples 15-19, further including instructions that cause the test and measurement to receive an input indicating a location on the magnetic hysteresis loop cycle that corresponds to the maximum magnetic flux, and the one or more processors are further configured to determine a corresponding point in at least one of the current signal or the voltage signal.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:
   at least one port configured to receive a signal from a device under test, the signal including a current signal acquired across a magnetic core of the device under test and a voltage signal acquired across the magnetic core of the device under test;
   one or more processors configured to:
      determine a magnetic hysteresis loop based on the current signal and the voltage signal, the magnetic hysteresis loop including a number of cycles,
      determine a magnetic flux of the magnetic core based on the electric voltage signal and the electric current signal for a number of sample points for each cycle,
      for each cycle, based on the determined magnetic flux for the number of sample points, determine a maximum magnetic flux of a present cycle, and
      select the maximum magnetic flux of all the cycles and determine a magnetic hysteresis loop cycle that corresponds to the maximum magnetic flux of all the cycles; and
   a display configured to display at least one of the magnetic hysteresis loop, the signal received from the device under test, and the magnetic hysteresis loop cycle that corresponds to the maximum magnetic flux of all the cycles;
   wherein the one or more processors are further configured to determine at least one of a corresponding portion of the current signal and a corresponding portion of the voltage signal that corresponds to the maximum magnetic flux of all the cycles; and
   wherein the display is further configured to display at least one of the corresponding portion of the current signal and the corresponding portion of the voltage signal.

2. The test and measurement instrument of claim 1, further comprising a user interface configured to receive a user input indicating magnetic properties of the magnetic core.

3. The test and measurement instrument of claim 2, wherein the user input is further configured to receive a user input indicating physical properties of the device under test, including a number of turns around the magnetic core and a cross section area of the magnetic core.

4. The test and measurement instrument of claim 1, wherein the display is configured to display the magnetic hysteresis loop and the magnetic hysteresis loop cycle that corresponds to the maximum magnetic flux of all the cycles in a color different from the magnetic hysteresis loop.

5. The test and measurement instrument of claim 1, further comprising a user input configured to receive an input indicating a location on the magnetic hysteresis loop cycle that corresponds to the maximum magnetic flux of all the cycles, and the one or more processors are further configured to determine a corresponding point in at least one of the current signal or the voltage signal.

6. The test and measurement instrument of claim 1, wherein the display is further configured to display the magnetic hysteresis loop and at least one of the current signal and the voltage signal, a first cursor indicating a point on the magnetic hysteresis loop, and a second cursor indicating the corresponding sample point in the at least one of the current signal and the voltage signal.

7. The test and measurement instrument of claim 6, further comprising a user input, wherein the display is further configured to move one of the first cursor or the second cursor in response to the user input, and to automatically move the other of the first cursor or the second cursor, so that the point on the magnetic hysteresis loop indicated by the first cursor continuously corresponds to the sample point in the at least one of the current signal and the voltage signal indicated by the second cursor.

8. A method for measuring a magnetic core of a device under test, comprising:
   receiving a signal from a device under test, the signal including a current signal acquired across a magnetic core of the device under test and a voltage signal acquired across the magnetic core of the device under test;
   determining a magnetic hysteresis loop based on the current signal and the voltage signal, the magnetic hysteresis loop including a number of cycles;
   determining a magnetic flux of the magnetic core based on the voltage signal and the current signal for a number of sample points for each cycle,
   for each cycle, based on the determined magnetic flux for the number of sample points, determining a maximum magnetic flux of a present cycle, and
   selecting the maximum magnetic flux of all the cycles and determining a magnetic hysteresis loop cycle that corresponds to the maximum magnetic flux of all the cycles;
   displaying at least one of the magnetic hysteresis loop, the signal received from the device under test, and the magnetic hysteresis loop cycle that corresponds to the maximum magnetic flux;
   determining at least one of a corresponding portion of the current signal and a corresponding portion of the voltage signal that corresponds to the maximum magnetic flux of all the cycles; and
   displaying at least one of the corresponding portion of the current signal and the corresponding portion of the voltage signal.

9. The method of claim 8, further comprising receiving a user input indicating magnetic properties of the magnetic core.

10. The method of claim 8, further comprising receiving an input indicating physical properties of the device under test, including a number of turns around the magnetic core and a cross section area of the magnetic core.

11. The method of claim 8, further comprising displaying the magnetic hysteresis loop and the magnetic hysteresis loop cycle that corresponds to the maximum magnetic flux of all the cycles in a color different from the magnetic hysteresis loop.

12. The method of claim 8, further comprising receiving an input indicating a location on the magnetic hysteresis loop cycle that corresponds to the maximum magnetic flux of all the cycles, and the one or more processors are further configured to determine a corresponding point in at least one of the current signal or the voltage signal.

13. The method of claim 8, further comprising:
   displaying the magnetic hysteresis loop and at least one of the current signal and the voltage signal;
   displaying a first cursor indicating a point on the magnetic hysteresis loop; and
   displaying a second cursor indicating the corresponding sample point in the at least one of the current signal and the voltage signal.

14. The method of claim 13, further comprising:
   receiving a user input indicating a desired movement of one of the first cursor or the second cursor;
   displaying the one of the first cursor or the second cursor moved in response to the user input; and
   displaying the other of the first or second cursor automatically moved so that the point on the magnetic hysteresis loop indicated by the first cursor continuously corresponds to the sample point in the at least one of the current signal and the voltage signal indicated by the second cursor.

15. One or more computer readable storage media having instructions stored thereon that, when executed by a processor of a test and measurement system, cause the test and measurement system to:
   receive a signal from a device under test, the signal including a current signal acquired across a magnetic core of the device under test and a voltage signal acquired across the magnetic core of the device under test;
   determine a magnetic hysteresis loop based on the current signal and the voltage signal, the magnetic hysteresis loop including a number of cycles;
   determine a magnetic flux of the magnetic core based on the voltage signal and the current signal for a number of sample points for each cycle;
   determine a maximum magnetic flux and a magnetic hysteresis loop cycle that corresponds to the maximum magnetic flux;
   determine at least one of a corresponding portion of the current signal and a corresponding portion of the voltage signal that corresponds to the maximum magnetic flux; and
   display on a display at least one of the corresponding portion of the current signal and the corresponding portion of the voltage signal.

16. The one or more computer readable storage media of claim 15, further including instructions that cause the test and measurement system to receive an input indicating physical properties of the device under test, including a number of turns around the magnetic core and a cross section area of the magnetic core.

17. The one or more computer readable storage media of claim 15, further including instructions that cause the test and measurement system to display on a display the magnetic hysteresis loop and the magnetic hysteresis loop cycle that corresponds to the maximum magnetic flux in a color different from the magnetic hysteresis loop.

18. The one or more computer readable storage media of claim 15, further including instructions that cause the test and measurement system to receive an input indicating a location on the magnetic hysteresis loop cycle that corresponds to the maximum magnetic flux, and the one or more processors are further configured to determine a corresponding point in at least one of the current signal or the voltage signal.

19. The one or more computer readable storage media of claim 15, further including instructions that cause the test and measurement system to:
- display the magnetic hysteresis loop and at least one of the current signal and the voltage signal;
- display a first cursor indicating a point on the magnetic hysteresis loop; and
- display a second cursor indicating the corresponding sample point in the at least one of the current signal and the voltage signal.

20. The one or more computer readable storage media of claim 19, further including instructions that cause the test and measurement system to:
- receive a user input indicating a desired movement of one of the first cursor or the second cursor;
- display the one of the first cursor or the second cursor moved in response to the user input; and
- display the other of the first or second cursor automatically moved so that the point on the magnetic hysteresis loop indicated by the first cursor continuously corresponds to the sample point in the at least one of the current signal and the voltage signal indicated by the second cursor.

* * * * *